US008452540B2

(12) United States Patent
Sugawara et al.

(10) Patent No.: US 8,452,540 B2
(45) Date of Patent: May 28, 2013

(54) EARTHQUAKE DAMAGE SPREAD REDUCING METHOD AND EARTHQUAKE DAMAGE SPREAD REDUCING SYSTEM FOR USE IN SEMICONDUCTOR MANUFACTURING APPARATUS

(75) Inventors: Yudo Sugawara, Oshu (JP); Hiroshi Kikuchi, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 1394 days.

(21) Appl. No.: 11/898,490

(22) Filed: Sep. 12, 2007

(65) Prior Publication Data

US 2008/0063994 A1    Mar. 13, 2008

(30) Foreign Application Priority Data

Sep. 13, 2006   (JP) .................................. 2006-248204
Aug. 10, 2007   (JP) .................................. 2007-208863

(51) Int. Cl.
*G01V 1/28* (2006.01)
(52) U.S. Cl.
USPC ............................................................ 702/15
(58) Field of Classification Search
USPC ............................................................ 702/15
See application file for complete search history.

(56) References Cited

U.S. PATENT DOCUMENTS

| 5,110,248 | A | * | 5/1992 | Asano et al. | ................... | 414/172 |
| 5,903,711 | A | * | 5/1999 | Okase | ........................... | 392/418 |
| 8,190,277 | B2 | * | 5/2012 | Sugawara et al. | ............... | 700/79 |
| 2003/0068219 | A1 | * | 4/2003 | Boonstra et al. | .............. | 414/935 |
| 2003/0157453 | A1 | * | 8/2003 | Irie et al. | ........................ | 432/239 |
| 2005/0016119 | A1 | * | 1/2005 | Hocking | ...................... | 52/741.1 |

FOREIGN PATENT DOCUMENTS

| JP | 2-265827 | 10/1990 |
| JP | 6-204108 | 7/1994 |
| JP | 11-159571 | 6/1999 |
| JP | 2000-150400 | 5/2000 |
| JP | 2000-286326 | 10/2000 |
| JP | 2002-93892 | 3/2002 |

OTHER PUBLICATIONS

Japanese Office Action issued on Mar. 22, 2011 for Application No. 2007-208863 w/ English language translation.

* cited by examiner

*Primary Examiner* — Bryan Bui
(74) *Attorney, Agent, or Firm* — Smith, Gambrell & Russell, LLP

(57) ABSTRACT

An earthquake damage spread reducing method and an earthquake damage spread reducing system, for use in a semiconductor manufacturing apparatus, which can predict occurrence of an earthquake and prevent fall down of a boat, thus minimizing damage by the earthquake. An earthquake damage spread reducing system includes a receiving unit for receiving urgent earthquake information, based on preliminary tremors, distributed via a communication network, or alternatively, includes a preliminary tremors detection unit for directly detecting the preliminary tremors. A control unit performs a first step of stopping operation of a semiconductor manufacturing apparatus, based on the urgent earthquake information received or on the preliminary tremors detected, as well as performs a second step of holding a boat in order to prevent fall of the boat, in which objects to be processed are loaded in a multistage fashion.

14 Claims, 9 Drawing Sheets

EARTHQUAKE DAMAGE SPREAD REDUCING METHOD AND EARTHQUAKE DAMAGE SPREAD REDUCING SYSTEM FOR USE IN SEMICONDUCTOR MANUFACTURING APPARATUS

CROSS REFERENCE TO RELATED APPLICATIONS

This application is based upon the prior Japanese Patent Application No. 2006-248204 filed on Sep. 13, 2006 and Japanese Patent Application No. 2007-208863 filed on Aug. 10, 2007, the entire contents of which are incorporated herein by reference.

BACKGROUND OF THE INVENTION

1. Field of the Invention

The present invention relates to an earthquake damage spread reducing method and an earthquake damage spread reducing system for use in a semiconductor manufacturing apparatus.

2. Background Art

The manufacture of semiconductor devices includes steps of providing various processes, such as oxidation, film forming, and the like, to each semiconductor wafer to be processed. As the apparatus for carrying out such processes, for example, a semiconductor manufacturing apparatus (also referred to as a vertical-type heating apparatus) is currently employed, which enables batch-type processes for multiple sheets of wafers (e.g., see Patent Document No. 1). The semiconductor manufacturing apparatus includes a loading area (or transfer area) below a vertical-type heating furnace having a furnace port at its bottom portion. In the loading area, a lifting mechanism, a loading mechanism, and the like are provided. The lifting mechanism is configured to carry in and carry out a boat relative to the heating furnace by raising and lowering a cover for opening and closing the furnace opening, while the boat is placed on a top portion of the cover via a heat insulating mould. In the boat, multiple sheets (about 100 to 150 sheets) of wafers each having a relatively large size, for example, a 300 mm diameter, are loaded. The loading mechanism is adapted to transfer the wafers between the boat and a carrier (or wafer storing container) in which the multiple sheets of wafers are stored.

As the semiconductor manufacturing apparatus, those employing the so-called two-boat system have been proposed, in each of which two boats are employed, whereby while the one boat is being loaded on the cover and carried into the heating furnace so as to be subjected to a heating process, the other boat can be used for changing processed semiconductor wafers with new ones.

The boat is made from quartz, which is quite expensive. The wafers are also expensive, thus the production cost will increase as the processing steps advance. Accordingly, handling of these components or materials must be carried out with greater care.

Patent Document 1: TOKUKAI No. JP2000-150400, KOHO

However, in the batch-type semiconductor manufacturing apparatus described above, the construction of the apparatus poses various restrictions on the conditions for the software and hardware, as such making it difficult to render the apparatus better suited for an earthquake resistant construction or earthquake-proof function, thus being currently insufficient against earthquake problems. Therefore, when an earthquake occurs and the apparatus experiences a greater shake, fall down and destruction of the boat, falling off from the boat of wafers and their breakage, and leakage of a gas may tend to be caused. In addition, if such damage occurs, it should take a longer time to make the apparatus recover for restart of the manufacture. Therefore, a greater earthquake would lead to more serious damage.

The present invention was made in light of the above circumstances, and it is therefore an object thereof to provide an earthquake damage spread reducing method and an earthquake damage spread reducing system for use in a semiconductor manufacturing apparatus, which method and system can predict occurrence of an earthquake in order to prevent fall down and destruction of the boat, minimize the damage and thus reduce the time required for recovery of the apparatus.

SUMMARY OF THE INVENTION

In order to achieve the above object, the present invention is characterized by an earthquake damage spread reducing method for use in a semiconductor manufacturing apparatus including a boat for loading objects to be processed therein, in a multistage fashion, the method comprising: a step of receiving urgent earthquake information based on preliminary tremors to be distributed via a communication circuit or directly detecting the preliminary tremors; a first step of stopping the operation of the semiconductor manufacturing apparatus based on the urgent earthquake information to be received or preliminary tremors to be detected; and a second step of holding the boat, in a contact or non-contact state, in order to prevent fall down of the boat, in which the objects to be processed are loaded in a multistage fashion, in parallel to the first step.

The present invention is characterized in that, in the second step performed in parallel to the first step, the boat is grasped and held, from above and below, in a contact or non-contact state, in order to prevent the fall down of the boat, in which the objects to be processed are loaded in a multistage fashion.

The present invention is characterized in that it further comprises, after the second step, a third step of returning the boat to a home position in which the boat is carried out of a heating furnace, due to a lifting mechanism.

The present invention is characterized in that the third step is performed after the second step as well as after the end of the principal shock.

The present invention is characterized by an earthquake damage spread reducing system for use in a semiconductor manufacturing apparatus including a heating furnace having a furnace port, a cover for opening and closing the furnace port, and a boat placed on the cover and adapted to load objects to be processed therein in a multistage fashion, the system comprising: a receiving unit for receiving urgent earthquake information based on preliminary tremors to be distributed via a communication circuit or a preliminary tremors detection unit for directly detecting the preliminary tremors; and a control unit for performing a first step of stopping the operation of the semiconductor manufacturing apparatus, based on the urgent earthquake information to be received or preliminary tremors to be detected, and a second step of holding the boat, in a contact or non-contact state, in order to prevent fall down of the boat, in which the objects to be processed are loaded in a multistage fashion.

The present invention is characterized in that the control unit performs the second step, such that the boat is grasped and held, from above and below, in a contact or non-contact state.

The present invention is characterized in that the semiconductor manufacturing apparatus further includes a lifting mechanism for carrying in or carrying out the boat relative to the heating furnace while the boat being placed on the cover, and a shutter adapted to cover the furnace port when the cover is opened; wherein the control unit performs the second step, such that the boat is raised from a carrying out position due to the lifting mechanism, so as to bring a top end portion of the boat closer to or into contact with a bottom face of the shutter, whereby the boat can be grasped and held between the shutter and the cover, from above and below, in a contact or non-contact state.

The present invention is characterized in that the earthquake damage spread reducing system further comprises a boat fall down preventing mechanism for performing the second step; the boat fall down preventing mechanism comprising: an arm supported by a bearing portion, such that the arm can be pivoted by a biasing means from an evacuating position located aside an actuating position immediately above the boat to be placed in the carrying out position in which it is carried out of the furnace port; a locking mechanism for locking the arm in the evacuating position, the locking being optionally released by the control unit; and a guide groove provided in the bearing portion, such that, when the arm is pivoted from the evacuating position to the actuating position, the arm can be lowered to grasp and hold the boat, between the arm and the cover, from above and below, in a contact or non-contact state.

The present invention is characterized in that the semiconductor manufacturing apparatus includes: a boat table provided in a loading area for performing a carrying in or carrying out work for the boat relative to the heating furnace and adapted to place one boat thereon, the boat being interchangeably used with the other boat placed on the cover; and a boat carrier mechanism for carrying the boat between the boat table and the cover, wherein the control unit controls the boat carrier mechanism, such that the boat placed on the boat table is raised, so as to bring a top end portion of the boat closer to or into contact with a ceiling portion in the loading area, whereby fall down of the boat can be prevented, by grasping and holding the boat, from above and below, in a contact or non-contact state.

The present invention is characterized in that the semiconductor manufacturing apparatus includes: a boat table provided in a loading area for performing a carrying in or carrying out work for the boat relative to the heating furnace and adapted to place one boat thereon, the boat being interchangeably used with the other boat placed on the cover; and a loading mechanism for transferring the objects to be processed between the boat placed on the boat table and a container containing the plurality of objects to be processed therein, wherein the control unit controls the loading mechanism so as to bring it closer to or into contact with a top end portion of the boat placed on the boat table, whereby fall down of the boat can be prevented, by grasping and holding the boat, from above and below, in a contact or non-contact state.

The present invention is characterized in that the semiconductor manufacturing apparatus includes: a rotary mechanism for rotating the boat placed on the cover; and a boat shower mechanism including a shower head, the shower head being longitudinally elongated and able to be advanced and retracted relative to the boat, in order to cool the boat to be carried out from the heating furnace, by blowing an inert gas against the boat, in the loading area for performing a carrying in or carrying out work for the boat relative to the heating furnace, wherein the control unit controls the rotary mechanism so as to rotate the boat placed on the cover and make it face the shower head as well as move the shower head closer to the boat, thereby to control leaping of the objects to be processed from the boat.

The present invention is characterized in that the semiconductor manufacturing apparatus includes: a boat table including a mounting portion for placing one boat thereon, the boat being interchangeably used with the other boat placed on the cover, in a loading area for performing a carrying in or carrying out work for the boat relative to the heating furnace; a fan filter unit for laterally injecting clean air toward the boat placed on the boat table; a locking mechanism for locking the mounting portion such that the boat will face a space opposite to the fan filter unit; and a biasing means adapted to apply biasing force to the mounting portion to rotate it, such that the boat will face the fan filter unit when the locking due to the locking mechanism is released, wherein the control unit release the locking mechanism, and thus the biasing means applies biasing force to the mounting portion so as to make the boat face the fan filter unit due to the rotation of the mounting portion, thereby to control leaping of the objects to be processed from the boat.

The present invention is characterized in that the control unit performs a third step of returning the boat to a home position in which the boat is carried out of the heating furnace, due to a lifting mechanism, after the second step.

The present invention is characterized in that the third step is performed after the second step as well as after the end of the principal shock.

According to the present invention, the operation of the semiconductor manufacturing apparatus can be optionally stopped, by utilizing urgent earthquake information of the preliminary tremors (or P wave) to be detected and distributed via a communication network(s), ten and several seconds earlier than the principal shock (or S wave), or by directly detecting the preliminary tremors. In addition, fall down of the boat due to the earthquake can be prevented, by holding the boat in a contact or non-contact state. Thus, the damage to be caused by the earthquake can be minimized and the time required for recovery of the apparatus can be significantly reduced.

In the case described above, the boat can be held, between the shutter and the cover, in a contact or non-contact state, by raising the boat from its carrying out position, due to the lifting mechanism for performing a carrying in or carrying out work for the boat relative to the heating furnace while the boat being placed on the cover for opening and closing the furnace port of the heating furnace, so as to bring the top end portion of the boat closer to or into contact with the bottom face of the shutter covering the furnace port when the cover is opened. Accordingly, without providing further new mechanisms in the loading area, the fall down of the boat can be prevented only by utilizing existent components and structures of the apparatus.

With the configuration comprising: the arm supported by the bearing portion, such that the arm can be pivoted by the biasing means from the evacuating position located aside the actuating position immediately above the boat to be placed in the carrying out position in which it is carried out of the furnace port while being placed on the cover for opening and closing the furnace portion of the heating furnace; the locking mechanism for locking the arm in the evacuating position, the locking being optionally released by the control unit; and the guide groove provided in the bearing portion, such that when the arm is pivoted from the evacuating position to the actuating position, the arm can be lowered to grasp and hold the boat, between the arm and the cover, from above and below, in a contact or non-contact state, the fall down of the boat can be prevented, without the lifting control due to the lifting mechanism.

With the configuration comprising: the boat table provided in the loading area and adapted to place one boat thereon, the boat being interchangeably used with the other boat placed on the cover; and the boat carrier mechanism for carrying the boat between the boat table and the cover, such that, under the control of the control unit, the boat carrier mechanism raises the boat placed on the boat table, so as to bring a top end portion of the boat closer to or into contact with a ceiling portion in the loading area, whereby fall down of the boat can be prevented, by grasping and holding the boat, from above and below, in a contact or non-contact state, the fall down of the boat placed on the boat table in the so-called two-boat system can be prevented, only by utilizing existent components and structures of the apparatus in the loading area.

With the configuration comprising: the boat table provided in the loading area and adapted to place one boat thereon, the boat being interchangeably used with the other boat placed on the cover; the boat carrier mechanism for carrying the boat between the boat table and the cover; and the loading mechanism for transferring the objects to be processed between the boat placed on the boat table and a container containing the plurality of objects to be processed therein, such that, under the control of the control unit, the loading mechanism is brought closer to or into contact with a top end portion of the boat placed on the boat table, whereby fall down of the boat can be prevented, by grasping and holding the boat, from above and below, in a contact or non-contact state, the fall down of the boat placed on the boat table in the so-called two-boat system can be prevented, only by utilizing existent components and structures of the apparatus in the loading area.

With the configuration comprising: the rotary mechanism for rotating the boat placed on the cover; and the boat shower mechanism including a shower head, the shower head being longitudinally elongated and able to be advanced and retracted relative to the boat, in order to cool the boat to be carried out from the heating furnace, by blowing an inert gas against the boat, in the loading area, such that, under the control of the control unit, the boat placed on the cover can be rotated to face the shower head as well as the shower head can be moved closer to the boat, thereby to control leaping of the objects to be processed from the boat, the leaping and damage to be caused by falling off of the objects to be processed from the boat placed on the boat table in the so-called two-boat system can be prevented by utilizing the existent shower head.

With the configuration comprising: the boat table including a mounting portion for placing one boat thereon, the boat being interchangeably used with the other boat placed on the cover, in the loading area; the fan filter unit for laterally injecting clean air toward the boat placed on the boat table; the locking mechanism for locking the mounting portion such that the boat will face a space opposite to the fan filter unit; and the biasing means adapted to apply biasing force to the mounting portion to rotate it, such that the boat will face the fan filter unit when the locking due to the locking mechanism is released, wherein the locking mechanism can be released under the control of the control unit, and then the boat can be caused to face the fan filter unit due to the rotation of the mounting portion, thereby to control leaping of the objects to be processed from the boat, the leaping and damage to be caused by falling off of the objects to be processed from the boat placed on the boat table in the so-called two-boat system can be prevented.

In addition, after the second step, or otherwise after the end of the principal shock after the second step, the boat can be returned to the home position, i.e., the carrying out position of the boat, in which it is carried out from the heating furnace, due to the lifting mechanism. Therefore, more rapid return of the semiconductor manufacturing apparatus to the operation can be secured.

BRIEF DESCRIPTION OF THE DRAWINGS

FIG. 5 is a diagram showing the boat fall down preventing mechanism, in which FIG. 5(a) is a plan view upon being not actuated, and FIG. 5(b) is a plan view upon being actuated.

FIG. 8 is a diagram showing a wafer leaping out preventing mechanism, in which FIG. 8(a) is a plan view upon being not actuated, and FIG. 8(b) is a plan view with the boat pivoted toward the wafer leaping out preventing mechanism.

FIG. 9 is a diagram showing the wafer leaping out preventing mechanism, in which FIG. 9(a) is a plan view, and FIG. 9(b) is a side view.

FIG. 10 is a diagram showing another wafer leaping out preventing mechanism, in which FIG. 10(a) is a plan view upon being not actuated, and FIG. 10(b) is a plan view upon being actuated.

FIG. 11 is a diagram showing the wafer leaping out preventing mechanism on a boat stage, in which FIG. 11(a) is a plan view upon being not actuated, FIG. 11(b) is a plan view upon starting actuation, FIG. 11(c) is a plan view during actuation, and FIG. 11(d) is a plan view upon the end of actuation.

DETAILED DESCRIPTION OF THE INVENTION

Examples

Figure 1:
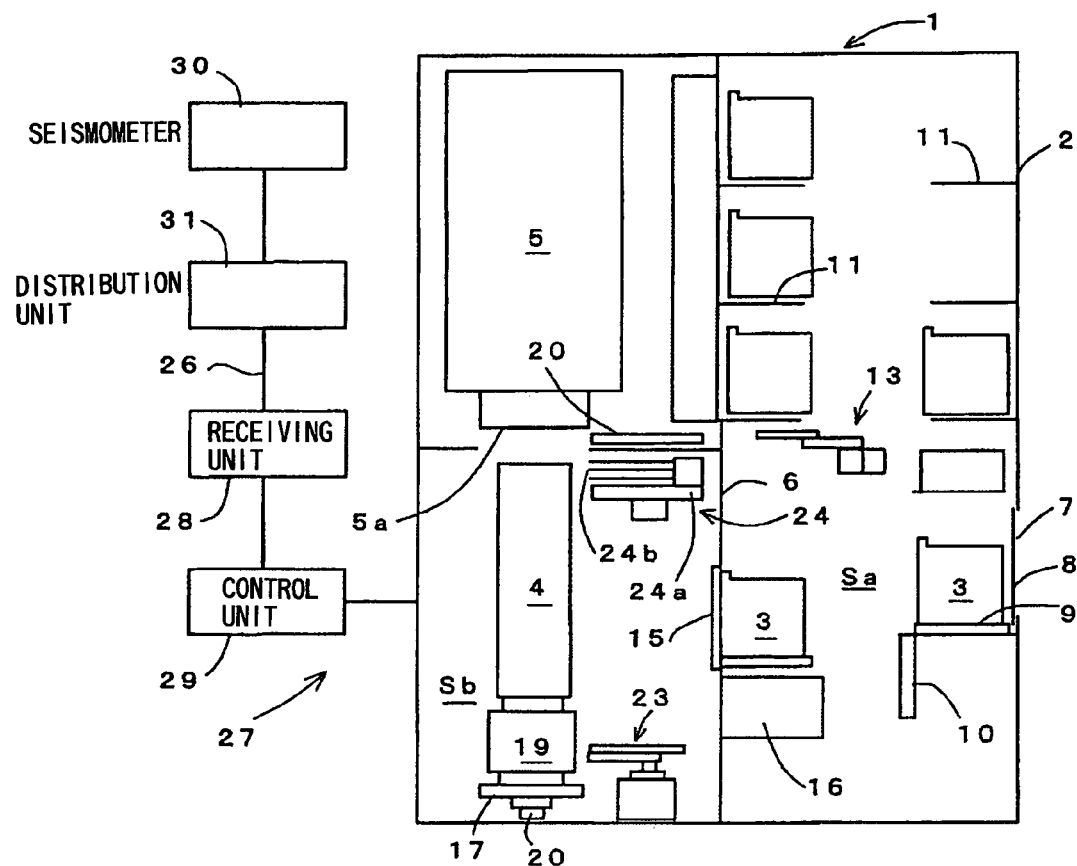
FIG. 1 is a diagram schematically showing an earthquake damage spread reducing system for use in a semiconductor manufacturing apparatus, which is one embodiment of the present invention.
Figure 2:
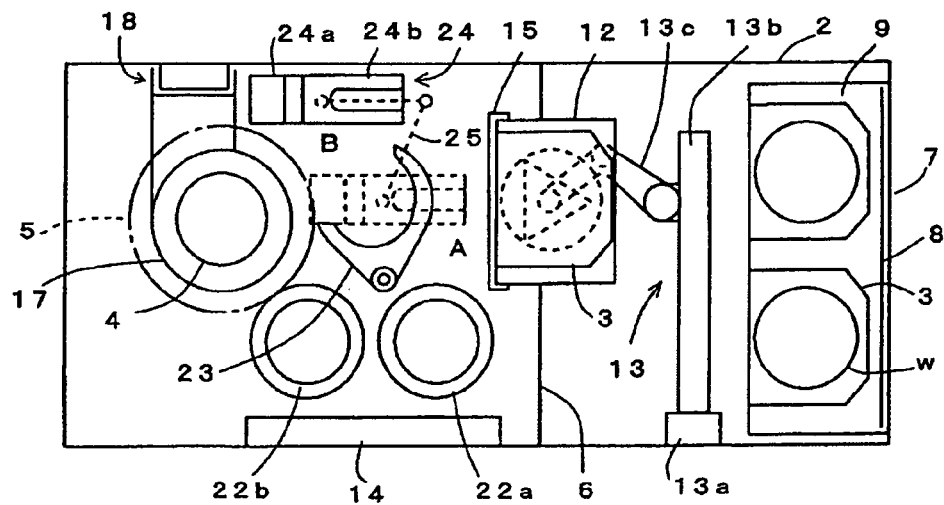
FIG. 2 is a lateral cross section of the semiconductor manufacturing apparatus shown in FIG. 1.
Figure 3:
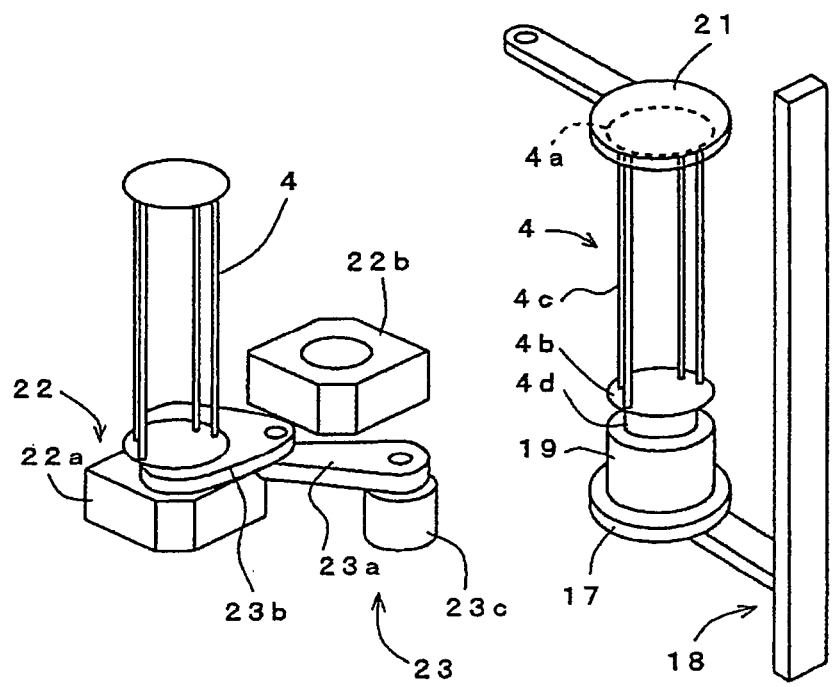
FIG. 3 is a perspective view showing a process for preventing fall down of a boat.

Hereinafter, the best mode for embodying the present invention will be detailed with reference to the attached drawings. FIG. 1 is a diagram schematically showing an earthquake damage spread reducing system for use in a semiconductor manufacturing apparatus, which is one embodiment of the present invention, FIG. 2 is a lateral cross section of the semiconductor manufacturing apparatus shown in FIG. 1, and FIG. 3 is a perspective view showing a process for preventing fall down of a boat.

In the drawings, reference numeral 1 designates a vertical-type heating apparatus installed in a clean room, which includes a housing 2 constituting an outer shell of the heating apparatus 1. In the housing 2, a carrying and storage area Sa and a loading area Sb are provided. The carrying and storage area Sa is used for carrying and storage of a carrier 3, which is a container adapted to contain objects to be processed, for example, multiple sheets of semiconductor wafers W, therein. The loading area Sb is used for transferring the wafers between the carrier 3 and a boat 4 for loading multiple sheets, for example, 100 to 150 sheets, of wafers, therein, in a multistage fashion with a predetermined pitch in the vertical direction, as well as it is used as a working area (loading area) for performing a carrying in or carrying out work for the boat 4 relative to a heating furnace 5. The carrying and storage area Sa and the loading area Sb are separated from each other by a partition wall 6.

The carrier 3 is formed of a plastic container, which can contain and carry multiple sheets, for example, 13 to 25 sheets, of wafers each having a predetermined size, for example, a 300 mm diameter, therein, in a multistage fashion with a predetermined pitch in the vertical direction. A cover (not shown), for airtightly closing a wafer taking out opening formed in a front face of the carrier 3, is provided detachably to the carrier 3.

A transfer port 7 is provided in the front face portion of the housing 2, for carrying in or carrying out the carrier 3, due to an operator or actuation of a carrier robot. To the transfer port 7, a door 8 is provided, such that it can be slidably opened and closed in the vertical direction. In the carrying and storage area Sa, a table 9 is provided for placing the carrier 3 thereon in the vicinity of the loading port 7, and a sensor mechanism 10, for detecting, each position and the number of sheets, of the wafers W, by opening the cover of the carrier 3, is provided behind the table 9. Above the table 9 and at an upper portion of the partition wall 6, storage shelves 11 are provided for storing the plurality of carriers 3.

A loading stage 12 is provided at the partition wall 6 in the loading and storage area Sa, for placing each carrier 3 thereon in order to perform loading of the wafers. In addition, a carrier mechanism 13, for carrying each carrier 3 between the table 9, storage shelves 11 and loading stage 12, is provided in the carrying and storage area Sa. The carrier mechanism 13 is mainly composed of a lifting arm 13b which is raised and lowered by a lifting mechanism 13a provided on one side of the carrying and storage area Sa, and a carrier arm 13c provided to the lifting arm 13b and adapted to support a bottom portion of each carrier 3 and carry it in the horizontal direction.

The carrier transfer area Sa is placed in an atmosphere cleaned by a fan filter unit (not shown). The loading area Sb is also cleaned by a fan filter unit 14 provided on one side thereof and placed under a positive pressure atmospheric condition or in an inert gas atmosphere (for example, consisting of $N_2$ gas). For the partition wall 6, an opening (not shown) is provided for bringing each carrier 3 into communication with the internal space of the loading area Sb, by making the front face of each carrier 3 placed on the loading stage 12 be in contact with the loading area Sb, from the side of the carrying and storage area Sa. Additionally, a door 15 is provided to open and close the opening of the partition wall 6, from the side of the loading area Sb. The opening of the partition wall 6 is formed to have a substantially the same size of the taking out opening of the carrier 3, such that the wafers can be placed in and taken out from the carrier 3 via the opening.

To the door 15 described above, a cover opening and closing mechanism (not shown) for opening and closing a cover of the carrier 3 and a door opening and closing mechanism (not shown) for opening and closing the door 15, from the side of the loading area Sb, are provided. Due to the cover opening and closing mechanism and the door opening and closing mechanism, the cover and door 15 can be moved to open toward the loading area Sb. In this case, the cover and door 15 can be moved (or evacuated) upward or downward to avoid being interference with the transfer of the wafers. Below the loading stage 12, a notch arranging mechanism 16 is located for arranging notches provided the respective peripheries of the wafers in one direction in order to align their crystal directions. The notch arranging mechanism 16 is opened to face the loading area Sb and configured to arrange the notches of the respective wafers to be transferred from each carrier 3 on the loading stage 12 due to a loading mechanism 24 as will be described below.

At an upper portion on the back side of the loading area Sb, a vertical-type heating furnace 5 having a furnace port 5a at its bottom portion is located. In the loading area Sb, a lifting mechanism 18 is provided. The lifting mechanism 18 is configured to raise and lower a cover 17 for opening and closing the furnace port so as to carry in and carry out a boat 4 made from quartz relative to the heating furnace 5, while the boat 4 is placed on a top portion of the cover 17. In the boat 4, multiple sheets (for example, about 100 to 150 sheets) of wafers W are loaded in a multistage fashion, with a predetermined interval, in the vertical direction. On a top portion of the cover 17, a heat insulating mould 19 is placed for suppressing heat radiation from the furnace port 5a to be generated upon closing the port 5a with the cover 17. The boat 4 is placed on the top portion of the heat insulating mould 19. Around the furnace port 5a, a shutter 21 is provided, such that it can be moved (or pivoted) in the horizontal direction so as to open and close the port 5a. The shutter 21 functions to cover the furnace port 5a upon carrying out the boat 4 having been subjected to the heating process after the cover 17 has been opened. The shutter 21 includes a shutter driving mechanism (not shown) adapted to pivot it in the horizontal direction so as to open and close the furnace port 5a.

On one side, i.e., on the side of the fan filter unit, of the loading area Sb, a boat table (also referred to as a boat stage) 22 is provided for placing the boat 4 thereon in order to transfer the wafers W. While the boat table 22 may be a single unit, it is preferred that the table 22 is composed of two stages, i.e., a first table (or charge stage) 22a and a second table (or standby stage) 22b, which are arranged front and back, along the fan filter unit 14, as shown in FIG. 2.

At a lower portion of the loading area Sb and between the loading stage 12 and the heating furnace 5, a boat carrier mechanism 23 is provided, for carrying the boat 4 between the boat table 22 and the cover 17, more specifically, between the first table 22a or second table 22b of the boat table 22 and the cover 17 in its lowered state, and between the first table 22a and the second table 22b. Above the boat carrier mechanism 23, the loading mechanism 24 is provided, for loading the wafers W, between each carrier 3 on the loading stage 12 and the boat 4 on the boat table 22, more specifically, between the carrier 3 on the loading stage 12 and the notch arranging mechanism 16, between the notch arranging mechanism 16 and the boat 4 on the first table 22a of the boat table 22, and between the boat 4 after subjected to the heating process on the first table 22a and the vacant carrier 3 on the loading stage 12.

The boat 4 is formed by arranging a plurality of, for example, four, struts 4c between a top plate 4a and a bottom plate 4b, as shown in FIG. 3. At a lower portion of the bottom plate 4b, a reduced diameter portion 4d having a diameter smaller than that of the bottom plate 4b is provided. In each strut 4c, grooves (not shown), for holding the wafers, one for each wafer, in a multistage fashion, are formed, with a predetermined pitch provided therebetween. Two, left and right, struts 4c located on the front face side are spaced away, to some extent, from each other, in order to put in and take out each wafer through the so-provided space.

The boat carrier mechanism 23 includes arms, which are adapted to support the single boat 4 in the vertical direction and can be extended in the horizontal direction. Specifically, the boat mechanism 23 includes a first arm 23a, which can be pivoted in the horizontal direction as well as can be moved in the vertical direction, a flat and generally C-shaped second arm 23b, which is pivotally supported in the horizontal direction, at a distal portion of the first arm 23a and is configured to horizontally engage with and support the reduced diameter portion 4d located under the boat 4, and a driving unit 23c for driving both of the first arm 23a and second arm 23b. Additionally, the boat mechanism 23 is configured to enable transfer of each wafer in the horizontally linear direction, by synchronizing the horizontally pivotal movements of the first arm 23a and second arm 23b, while the center of an engaging portion of the second arm 23b and the pivotal center of the first arm 23a are arranged in a straight line. Due to expansion and contraction of such arms, the area in which the boat 4 is carried can be minimized, thereby reducing the width and length of the apparatus.

The loading mechanism 24 is composed of multiple sheets, for example, five sheets, of thin-plate like loading arms 24b placed on a horizontally pivotable base 24a. Each of the loading arms 24b is used for placing a semiconductor wafer thereon and adapted to be advanced and retracted. In order to avoid being interference with the boat 4, the loading mechanism 24 is configured to evacuate laterally, via a pivot arm 25, from a working position A designated by imaginary lines to an evacuating position B designated by solid lines, as shown in FIG. 2. Among the five loading arms 24b, it is preferred that the central one sheet-feeding type loading arm can be moved front and back independently of the other four loading arms above the base 24, while the pitch between the other four loading arms can be changed in the vertical direction on the basis of the central loading arm. The pivot arm 25 is connected with a lifting mechanism (not shown) provided on the other side of the loading area Sb, thereby making the loading mechanism 24 movable in the vertical direction.

In order to protect the vertical-type heating apparatus 1 constructed as described above from an earthquake, an earthquake damage spread method for the vertical-type heating apparatus 1 of the present invention comprises: a step of receiving urgent earthquake information based on preliminary tremors (or P wave) to be distributed via a communication network 26, a first step of stopping the operation of the vertical-type heating apparatus 1 based on the urgent earthquake information, and a second step of grasping and holding the boat 4, from above and below, in a contact or non-contact state, in order to prevent fall down of the boat 4, in parallel to the first step. An earthquake damage spread reducing system 27 for performing the method described above comprises: a receiving unit 28 for receiving the urgent earthquake information, based on preliminary tremors (P wave), to be distributed via the communication network 26, and a control unit 29 for performing the first step of stopping the operation of the vertical-type heating apparatus 1 based on the urgent earthquake information obtained from the receiving unit 28 and the second step of grasping and holding the boat 4, from above and below, in a contact or non-contact state, in order to prevent fall down of the boat 4, in which the wafers are loaded in a multistage fashion.

As the urgent earthquake information, an urgent earthquake report presented by the Meteorological related Agency and/or an urgent earthquake detection system provided by a third presenter can be utilized. The earthquake consists of preliminary tremors, small tremors consisting of longitudinal and high-speed (7 km to 8 km/second) P (primary) waves, and a principal shock, greater tremors consisting of transverse and low-speed (3 km to 4 km/second) S (secondary) waves. The hypocenter, seismic intensity and time of arrival of the S waves are calculated, by processing data of the P waves collected from a number of seismometers 30 installed in various places over the country. The so-calculated earthquake information is then distributed, via wire circuits and/or satellite circuits, from a distribution unit 31, and received by the receiving unit 28. In this manner, an expected seismic intensity can be predicted, ten and several seconds earlier than the principal shock consisting of greater tremors, thereby preparing for the principal shock, in advance. The control unit 29 is set at a predetermined threshold value (for example, an expected seismic intensity of 5), and is configured to perform the aforementioned earthquake damage spread reducing method when an earthquake occurs, exceeding the threshold value.

In the first step, a power source (main power source) of the heating apparatus 1 is turned OFF and a gas line is shut off. Alternatively, the main power source may be kept ON immediately before the arrival of the principal shock (or S wave). In the case of turning OFF the main power source in the first step (or P wave), an auxiliary power source must be prepared for the lifting mechanism 18, boat carrier mechanism 23 and loading mechanism 24, which should be actuated upon grasping and holding the boat 4, from above and below, in order to prevent fall down of the boat 4. In this embodiment, in the second step, as shown in FIG. 3, the boat 4 is raised by the lifting mechanism 18 from a carrying out position (or lowered position), so as to bring a top end (top plate 4a) of the boat 4 closer to or into contact with a bottom portion of the shutter 21 covering the furnace port 5a when the cover 17 is opened. In this manner, the boat 4 can be grasped and held, from above and below, between the shutter 21 and the cover 17. Preferably, a recess, which can engage with and hold the top end (top plate 4a) of the boat 4, is formed in the bottom face of the shutter 21, in order to prevent lateral displacement of the boat 4 due to horizontal shaking.

In addition, after the second step, or otherwise after the end of the principal shock after the second step, the control unit 29 is preferably configured to perform a third step of returning the boat 4 to a home position HP, which is the carrying out position for the boat 4 to be carried out from the heating furnace 5 due to the lifting mechanism 18.

According to the earthquake damage spread reducing method and earthquake damage spread reducing system 27 constructed as described above, by employing the urgent earthquake information, based on preliminary tremors (or P wave), to be detected several seconds to ten and several seconds earlier than the principal shock (or S wave) and distributed via a communication network, and by stopping the operation of the vertical-type heating apparatus 1, while grasping and holding the boat 4, from above and below, in a contact or non-contact state; spreading of damage of articles, such as fall down and/or destruction of the boat 4, and time loss due to recovery of the apparatus or the like, to be caused by an earthquake, can be prevented. In this case, the boat 4 is raised from the carrying out position located at a lower portion of the loading area Sb, by using the lifting mechanism 18 for performing a carrying in or carrying out work for the boat 4 relative to the heating furnace 5 while the boat 4 being placed on the upper portion of the cover 17 adapted to open and close the furnace port 5a of the heating furnace 5, as such bringing the top end of the boat 4 closer to or into contact with the bottom face of the shutter 21 covering the furnace port 5a when the cover 17 is opened. Thus, the boat 4 can be grasped and held, between the shutter 21 and the cover 17, from above and below, in a contact or non-contact state. Consequently, without adding new mechanisms in the loading area Sb, fall down of the boat 4 can be prevented by utilizing existent components and structures of the apparatus. While the boat 4 can be held by grasping it from above and below in a contact state, the boat 4 is preferably held in a non-contact state because of reduction or suppression of occurrence of particles. In addition, after the second step, or otherwise after the end of the principal shock after the second step, the boat 4 is returned to the home position HP, i.e., the carrying out position of the boat 4, in which it is carried out from the heating furnace 5 due to the lifting mechanism 18. Therefore, more rapid return of the semiconductor manufacturing apparatus 1 to the operation can be secured.

Figure 4:
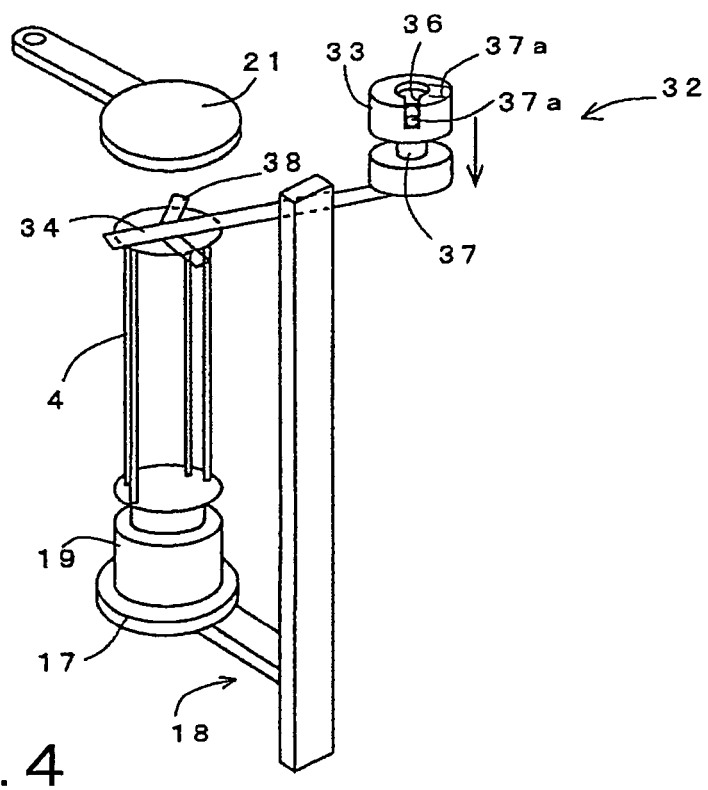
FIG. 4 is a perspective view showing a boat fall down preventing mechanism.
Figure 5:
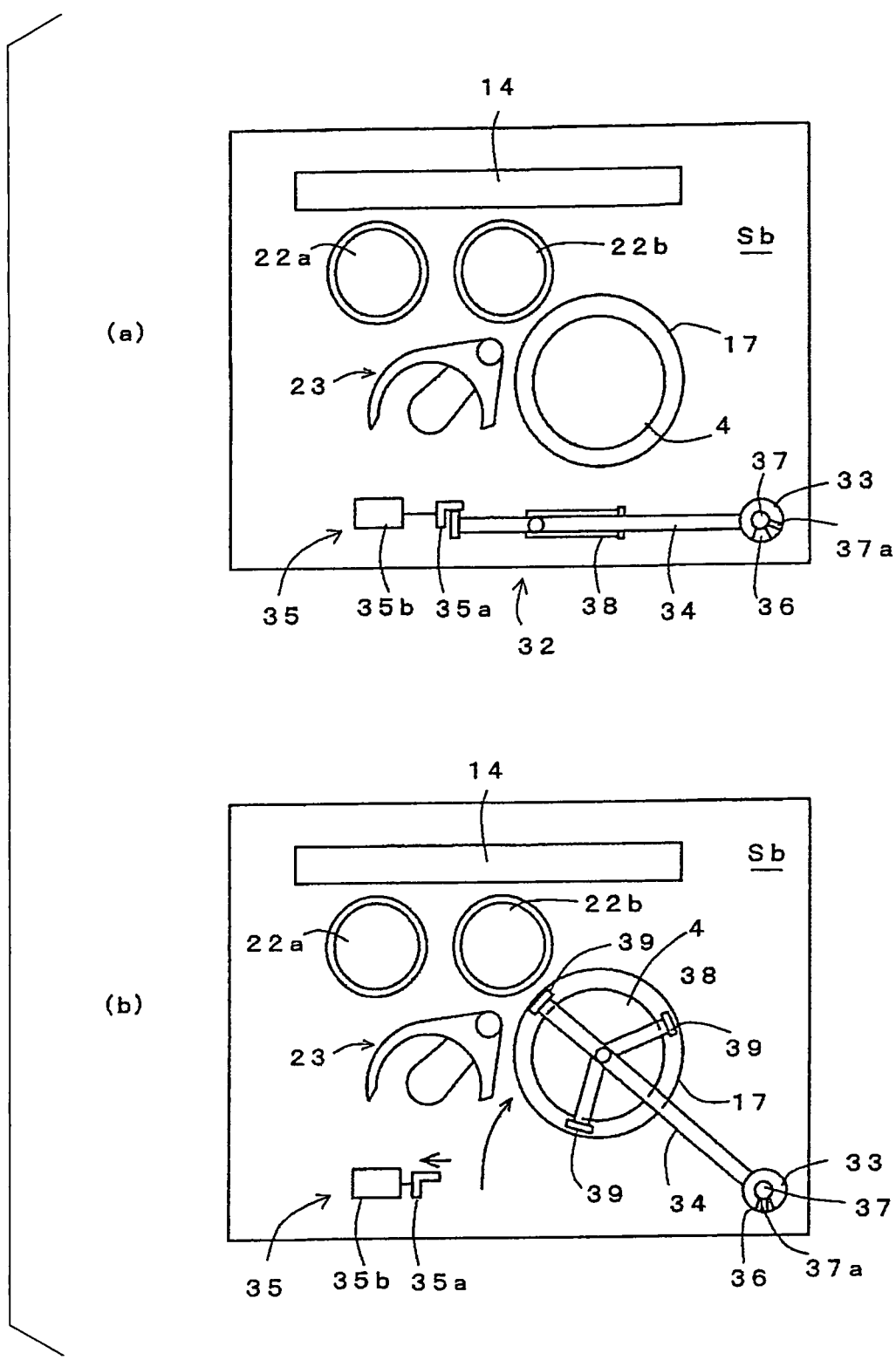

FIG. 4 is a perspective view showing a boat fall down preventing mechanism. FIG. 5 is a diagram showing the boat fall down preventing mechanism, in which FIG. 5(a) is a plan view upon being not actuated, and FIG. 5(b) is a plan view upon being actuated. The embodiment, shown in FIGS. 4 and 5, includes a boat fall down preventing mechanism 32 for performing the second step described above. The boat fall down preventing mechanism 32 includes an arm 34, a locking mechanism 35, and a guide groove or slit 36. The arm 34 is supported by a bearing portion 33, such that the arm 34 can be pivoted by a biasing means, such as a spring (not shown), from the an evacuating position located aside an actuating position immediately above the boat 4 to be in the carrying out position where the boat 4 is carried out from the furnace port 5a while being placed on the cover 17 for opening and closing the furnace port 5a of the heating furnace 5. The locking mechanism 35 serves to lock the arm 34 in the evacuating position, wherein the locking mode can be released optionally by the control unit 29. The guide slit 36 is provided in the bearing portion 33, such that, when the arm is pivoted from the evacuating position to the actuating position, the arm 34 can be lowered to grasp and hold the boat 4, between the arm 34 and the cover 17, from above and below, in a contact or non-contact state.

A post 37 projects upward from a proximal end of the arm 34, such that it can be pivoted relative to the bearing 33. The bearing 33 is fixed in a predetermined position. A locking pin 37a is attached at a top end portion of the post 37, wherein the locking pin 37a is locked at an upper end face of the bearing 33 so as to prevent falling off of the post 37. The locking pin 37a can slide along the upper end face of the bearing 33 along with the pivot movement of the arm 34 or the same of the post 37. The guide slit 36 is formed in the upper end face of the bearing 33, such that, when the arm 34 is pivoted from the evacuating position to the actuating position, the locking pin 37a will fall through the slit, thereby lowering the arm 34. The locking mechanism 35 includes a flat and generally L-shaped locking member 35a adapted to engage with a distal end of the arm 34 located in the evacuating position and hold it in the same position, and a driving section, such as an air cylinder 35b, for advancing and retracting the locking member 35a relative to the distal end of the arm 34 located in the evacuating position.

While the arm 34 may be configured to be lowered, by its own weight, when moved from the evacuating position to the actuating position, it may be lowered, by force, by using a biasing means, such as a spring. It is preferred that a pair of auxiliary members 38 are provided at the distal end of the arm 34, such that they can be contracted when the arm 34 is in the evacuating position while they can be spread, by spring force, when the arm 34 is in the actuating position, so as to press down the top end portion (or top plate) of the boat 4. More preferably, nails 39 for restricting movement in the radial direction of the top end portion (or top plate) of the boat 4 are provided at the distal end of the arm 34 and at the distal ends of the auxiliary members 38.

According to the embodiment shown in FIGS. 4 and 5, the boat fall down preventing mechanism 32 constructed as described above is provided in the loading area, in addition to the lifting mechanism 18. The fall down of the boat 4 can be prevented even without the lifting control due to the lifting mechanism 18. Additionally, since the arm 34 of the boat fall down preventing mechanism 32 is in the evacuating position, located aside the actuating position, when being not actuated, it will not interfere with the carrying in or carrying out work for the boat 4 relative to the heating furnace 5.

Figure 6:
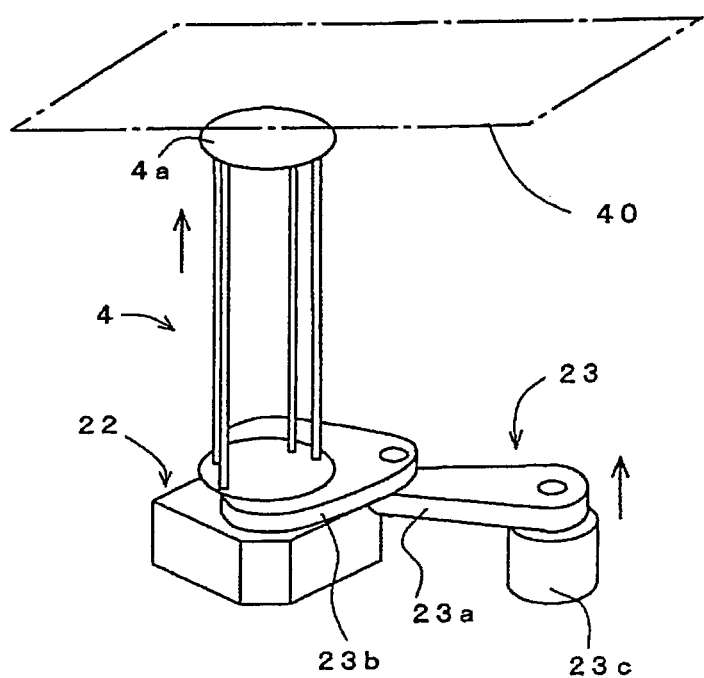
FIG. 6 is a perspective view illustrating a method of preventing fall down of the boat placed on a boat stand.

FIG. 6 is a perspective view illustrating a method of preventing fall down of the boat placed on a boat stand. In the embodiment shown in FIG. 6, the earthquake damage spread reducing system in the vertical-type heating apparatus including a two-boat system is configured, such that the boat carrier mechanism 23 raises the boat 4 placed on the boat table 22 under the control due to the control unit 29 so as to bring the top end of the boat closer to or into contact with a ceiling portion 40 of the loading area Sb, thereby to grasp and hold the boat 4, from above and below, in a contact or non-contact state, as such preventing the fall down of the boat. According to the embodiment shown in FIG. 6, in the case of employing the so-called two-boat system, the fall down of the boat placed on the boat table 22 due to an expected earthquake can be prevented by utilizing the existent structures (i.e., the boat carrier mechanism 23 and ceiling portion 40) located in the loading area.

Figure 7:
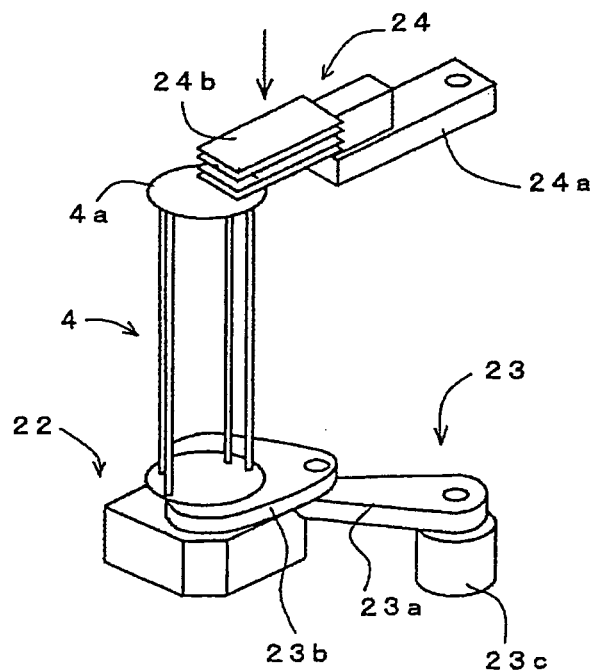
FIG. 7 is a perspective view illustrating another method of preventing fall down of the boat placed on the boat stand.

FIG. 7 is a perspective view illustrating another method of preventing the fall down of the boat placed on the boat stand. In the embodiment shown in FIG. 7, the earthquake damage spread reducing system in the vertical-type heating apparatus including the two-boat system is configured, such that the loading mechanism 24 is moved under the control due to the control unit 29 so as to be brought closer to or into contact with the top end of the boat 4 placed on the boat table 22 in order to restrict movement of the boat 4, thereby to grasp and hold the boat 4, from above and below, in a contact or non-contact state, thus preventing the fall down of the boat. In this case, it is preferred that the loading mechanism 24 is configured such that the loading arm 24b can project outward from a distal end of the base 24a, whereby the top end of the boat 4 can be pressed downward by the bottom face of the loading arm 24b. Accordingly, the embodiment shown in FIG. 7 can also prevent the fall down of the boat 4 placed on the boat table 22 in the so-called two-boat system, by utilizing the existent structures (i.e., the boat table 22 and loading mechanism 24) located in the loading area Sb.

Figure 8:
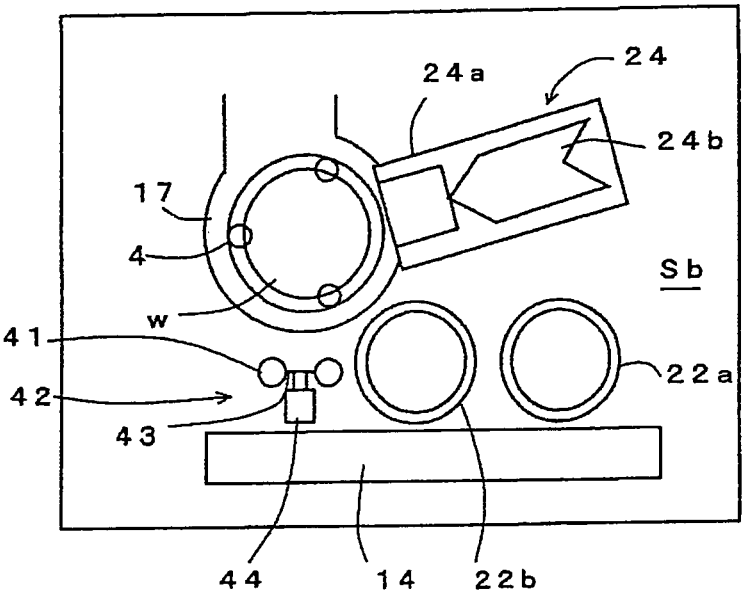
Figure 8:
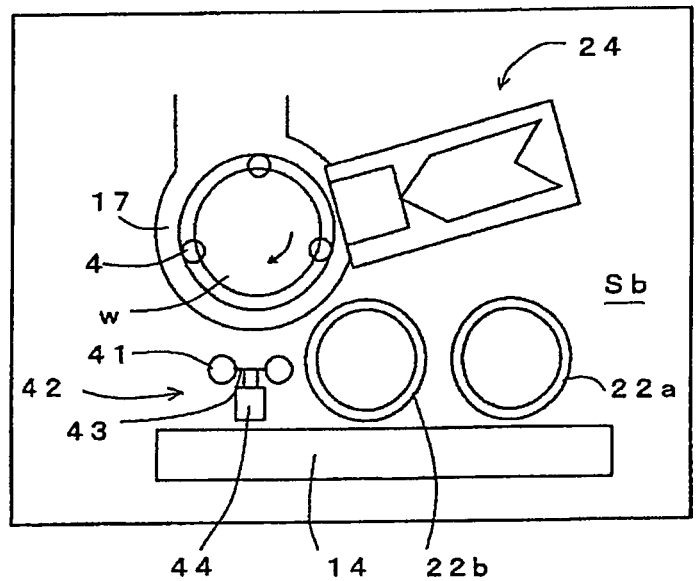
Figure 9:
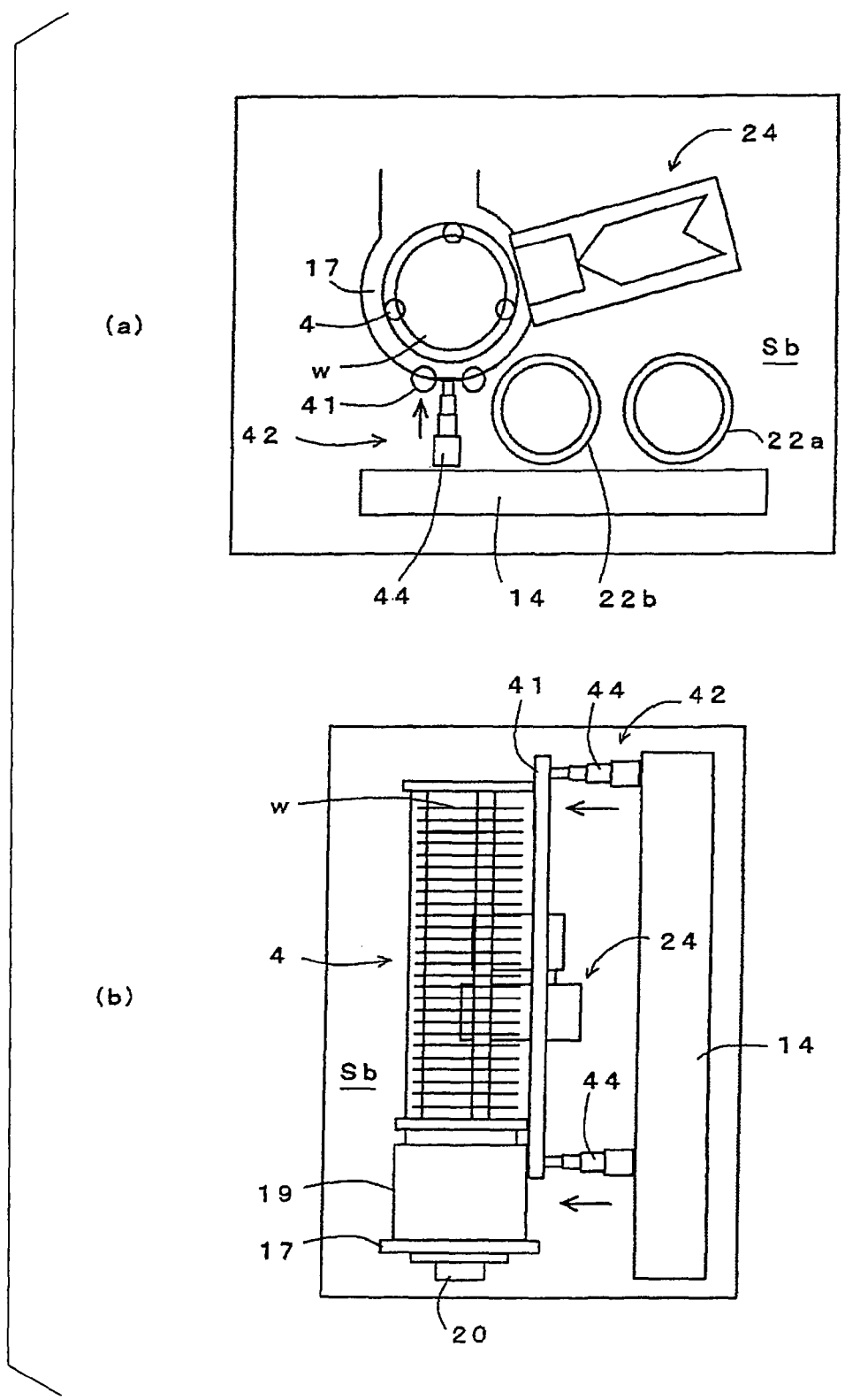

FIG. 8 is a diagram showing a wafer leaping out preventing mechanism, in which FIG. 8(a) is a plan view upon being not actuated, and FIG. 8(b) is a plan view with the boat pivoted toward the wafer leaping out preventing mechanism. FIG. 9 is a diagram showing the wafer leaping out preventing mechanism, in which FIG. 9(a) is a plan view, and FIG. 9(b) is a side view. The embodiment shown in FIGS. 8 and 9 includes a rotary mechanism 20 adapted to rotate the boat 4 placed on the cover 17, and a boat shower mechanism 42. The boat shower mechanism 42 includes a shower head 41, which is longitudinally elongated and able to be advanced and retracted relative to the boat 4, in order to cool the boat 4 to be carried out from the heating furnace 5 in the loading area Sb, by blowing laterally (or in the direction from the fan filter unit 14) an inert gas against the boat 4. Thus, leaping of the wafers W out of the boat 4 can be controlled, by rotating the boat 4 placed on the cover 17 by utilizing the rotary mechanism 20 under the control of the control unit 29 so as to direct the boat 4 toward the shower head 41 (see FIG. 8(b)), as well as by moving the shower head 41 closer to the boat 4 (see FIGS. 9(a) and 9(b)).

The shower head 41 is composed of, for example, a pair of left and right pipes, top and bottom ends of which are closed. A supply hose for supplying an inert gas, for example, $N_2$ gas, is connected with each pipe. In a front face portion of each pipe, blowing holes (not shown) are formed with a predetermined pitch therebetween, each blowing hole being adapted to inject the inert gas toward the boat. The pair of left and right pipes constituting the shower head 41 are connected with each other via a connecting members 43 disposed on and under these pipes. The boat shower mechanism 42 includes a reciprocating means, for example, a telescopic-type air cylinder 44, which is adapted to advance and retract the shower head 41 relative to the boat 4 placed on the cover 17. A distal end of the air cylinder 44 is connected to the upper and lower connecting members 43, respectively. A proximal end of the air cylinder 44 is disposed, for example, at or in the vicinity of a front face portion of the fan filter unit 14.

In this case, in order to prevent fall down and/or destruction of the boat 4 due to shaking of an earthquake, the apparatus is constructed on the premise that the boat should be grasped and held from above and below in a contact or non-contact state, as described above. As the method for preventing the fall down and/or destruction of the boat, the boat 4 may be grasped or interposed between the base 24a and the shower head 41, as shown in FIG. 9, while an end portion of the base 24a of the loading mechanism 24 being closer to or in contact with a side face of the boat 4. Alternatively, the boat fall down preventing mechanism as shown in FIGS. 3 and 4 or the like may be utilized. According to the embodiment shown in FIGS. 8 and 9, since the shower head 41 can be advanced and retracted relative to the boat 4 due to the air cylinder 44 of the boat shower mechanism 42, while the boat 4 placed on the cover 17 being rotated due to the rotary mechanism 20 so as to face the shower head 41, leaping and falling off of the wafers W from the boat 4 can be prevented and thus breakage to be caused by the falling off of the wafers W from the boat 4 can be prevented, by utilizing such an existent shower head 41.

Figure 10:
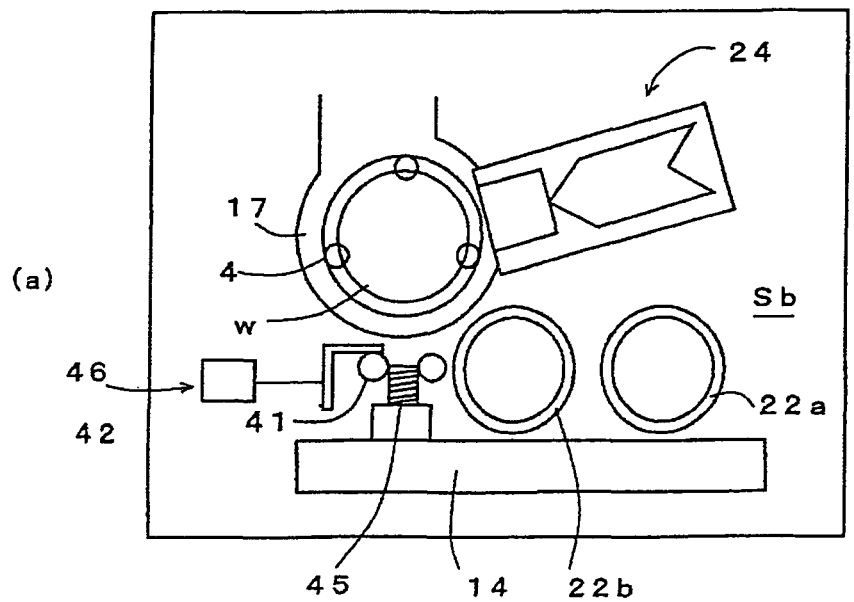
Figure 10:
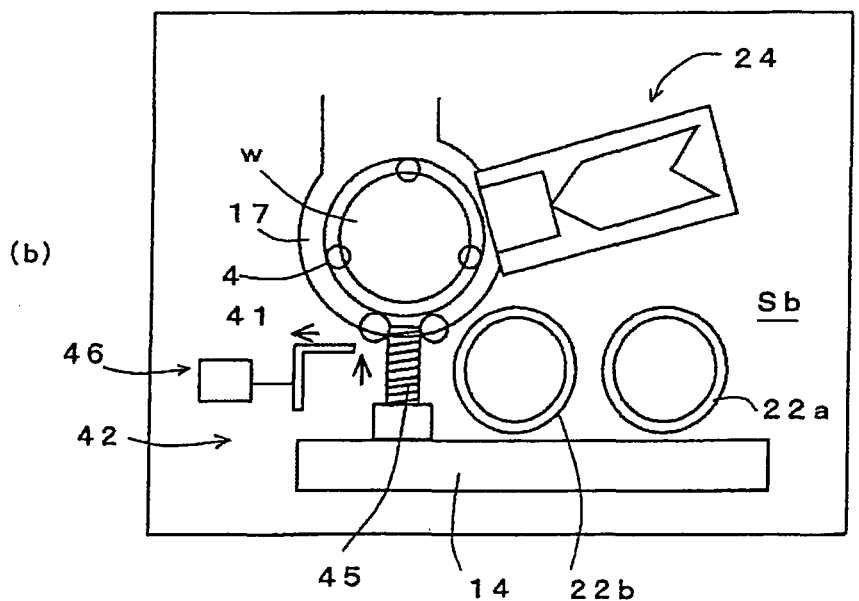

FIG. 10 is a diagram showing another wafer leaping out preventing mechanism, in which FIG. 10(a) is a plan view upon being not actuated, and FIG. 10(b) is a plan view upon being actuated. In place of the air cylinder (or reciprocating means) for the boat shower mechanism 42 in the embodiment shown in FIGS. 8 and 9, the embodiment shown in FIG. 10 includes a biasing means, for example, a spring 45, for applying basing force to the shower head 41 so as to move it, from an evacuating position spaced away from the boat 4 for avoiding interference with raising or lowering of the cover 17, to an actuating position closer to the boat 4; and a locking mechanism 46 for locking the shower head 41 in the evacuating position against the biasing force of the spring 45. In this case, the locking due to the locking mechanism 46 can be released under control of the control unit 29. According to the embodiment shown in FIG. 10, when the locking for the shower head 41 in the evacuating position due to the locking mechanism 46 is released by the control unit 29 based on earthquake information, the shower head 41 is automatically moved closer to the front face of the boat 4 due to the biasing force of the spring 45. Thus, similar to the embodiment shown in FIGS. 8 and 9, leaping and falling off of the wafers W from the boat 4 can be prevented, as such breakage to be caused by the falling off of the wafers W from the boat 4 can be prevented.

Figure 11:
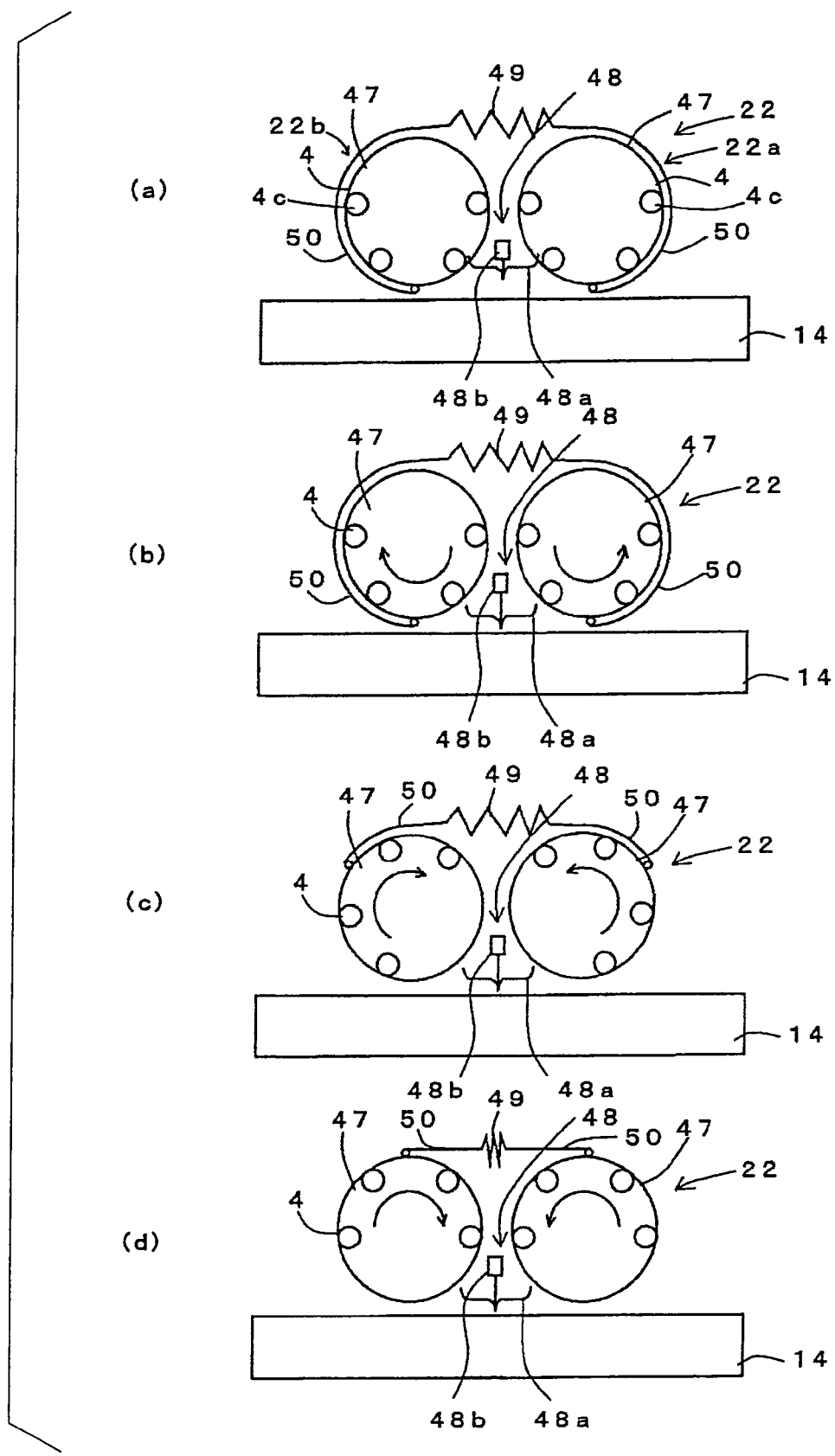

FIG. 11 is a diagram showing the wafer leaping out preventing mechanism on a boat stage, in which FIG. 11(a) is a plan view upon being not actuated, FIG. 11(b) is a plan view upon starting actuation, FIG. 11(c) is a plan view during actuation, and FIG. 11(d) is a plan view upon the end of actuation. The embodiment shown in FIG. 11 includes the boat table 22 (22a, 22b) including rotatable mounting portions 47 each adapted for placing the boat 4 thereon, one boat being used interchangeably with the other boat 4 placed on the cover 17 in the loading area Sb; the fan filter unit 14 for laterally injecting clean air toward the boats 4 placed on the boat table 22; a locking mechanism 48 for locking the mounting portions 47 such that each boat 4 placed thereon will face a space opposite to the fan filter unit 14, and a biasing means, for example, a spring 49, adapted to apply biasing force to the mounting portions 47 to rotate it, such that each boat 4 will face the fan filter unit 14 upon releasing the locking due to the locking mechanism 48. Thus, when releasing the locking due to the locking mechanism 48 under control of the control unit 29, the boats 4 can be moved to face the fan filter unit 14 by the rotation of the mounting portions 47 due to the biasing force applied from the spring 49, thereby suppressing the leaping of the wafers W out of the boats 4.

The mounting portions 47 shown in the drawings are composed of a pair of rotatable mounting portions arranged close to each other along the fan filter unit 14. The locking mechanism 48 is composed of a bifurcated pin 48a configured to be locked between the two mounting portions 47, and an actuator, for example, an air cylinder 48b, adapted to pull the locking pin 48a locked to both of the mounting portions 47 and detach it from these mounting portions 47. The spring 49 is formed of, for example, a coil spring, with string members 50 being connected with both ends. A distal end of each string member 50 is wound around the outer periphery of each mounting portion 47 and fixed thereto.

According to the embodiment shown in FIG. 11, when the locking due to the locking mechanism 48 is released under control of the control unit 29, the mounting portions 47 are rotated respectively by the biasing force to be applied from the spring 49, as such the boats 4 placed on the mounting portions 47 will face the fan filter unit 14, thereby preventing leaping of the wafers W out of the boats 4. Thus, damage of the wafers W due to leaping and falling off of the wafers from the boats 4 placed on the boat table 20 in the so-called two-boat system can be prevented. Also in the case of the embodiment shown in FIG. 11, in order to prevent fall down and destruction of the boats 4 placed on the mounting portions 47, the system is constructed on the premise that the boats 4 should be held by the loading mechanism 24 or the like holding means, as described above, for example, with respect to, the embodiment shown in FIG. 7. It should be appreciated that, in FIG. 11, each boat is schematically expressed, being placed on each mounting portion 47, wherein the orientation of each boat 4 is depicted as that defined by four struts 4c.

Figure 12:
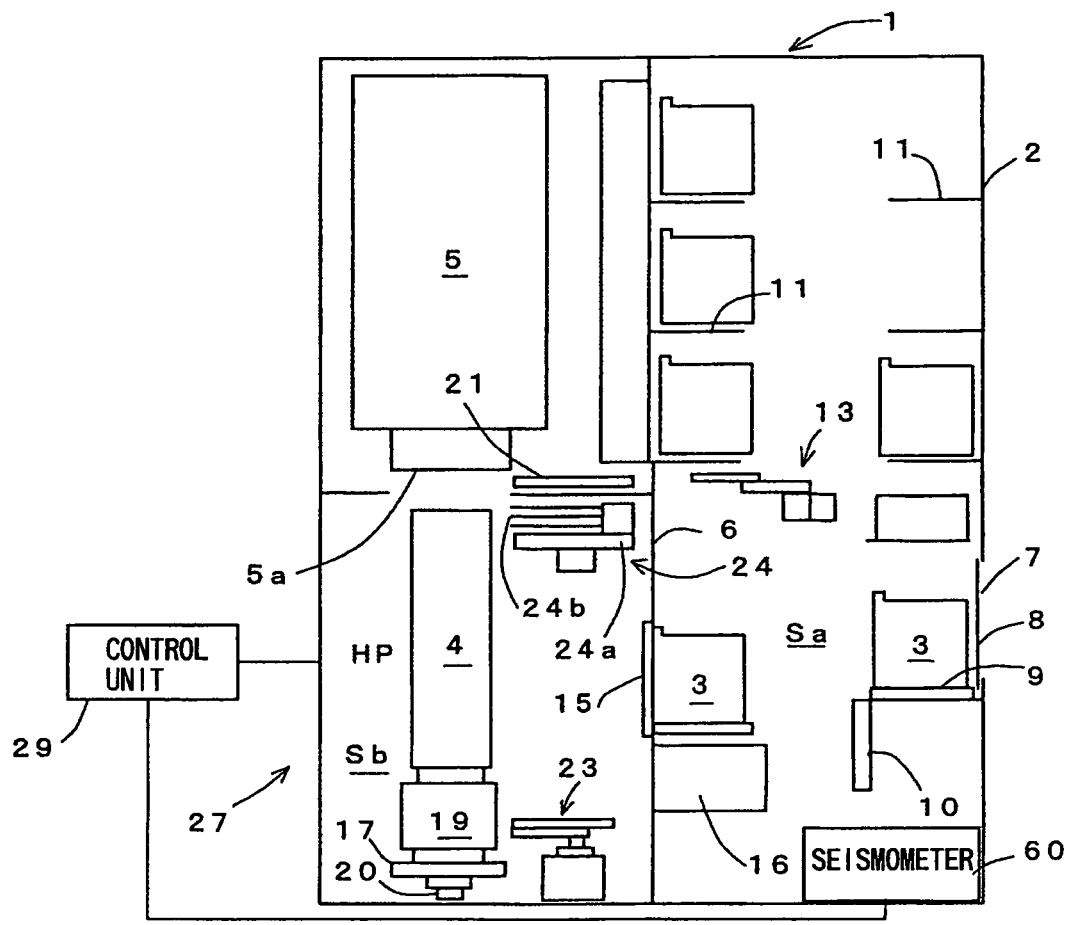
FIG. 12 is a diagram schematically showing the earthquake damage spread reducing system for use in a semiconductor manufacturing apparatus, which is another embodiment of the present invention.

FIG. 12 is a diagram schematically showing the earthquake damage spread reducing system for use in a semiconductor manufacturing apparatus, which is another embodiment of the present invention. In the embodiment shown in FIG. 12, like reference numerals are assigned to like parts of the embodiment shown in FIG. 1, respectively, and explanation for such parts will be omitted below. The vertical-type heating apparatus 1 of this embodiment includes a seismometer 60, which serves as a preliminary tremors detection unit for directly detecting preliminary tremors, and the control unit 29 for performing a first step of stopping the operation of the vertical-type heating apparatus 1 based on the preliminary tremors to be detected and a second step of holding the boat in a contact or non-contact state, or otherwise grasping and holding the boat 4, from above and below, in a contact or non-contact state, in order to prevent fall down of the boat 4. While it preferred that the seismometer 60 is installed in the housing 2, the seismometer 60 may be installed in a site of a factory. According to this embodiment, the preliminary tremors can be detected automatically without receiving urgent earthquake information, and fall down of the boat can be prevented by predicting occurrence of an earthquake, thereby minimizing dame of the earthquake.

In addition, after the second step, or otherwise after the end of the principal shock after the second step, the control unit 29 is preferably configured to perform a third step of returning the boat 4 to a home position HP, which is the carrying out position for the boat 4 to be carried out from the heating furnace 5 due to the lifting mechanism 18. Thus, more rapid return of the semiconductor manufacturing apparatus to the operation can be secured.

While the embodiments of the present invention have been described with reference to the drawings, this invention is not limited to these embodiments, but various modifications can be made without departing from the spirit and scope of this invention. For instance, while, in the embodiments described above, it is intended to prevent the fall down of the boat by utilizing existent components and structures without adding new mechanisms into the loading area, the present invention may be configured to prevent the fall down of the boat by using new mechanisms (e.g., new mechanical axes or exclusive mechanisms) without utilizing existent mechanical structures (e.g., existent axes). Additionally, the earthquake damage spread reducing system for use in the semiconductor manufacturing apparatus related to this invention may be configured to include a receiving unit for receiving urgent earthquake information based on preliminary tremors to be distributed via a communication network or networks, and a preliminary tremors detection unit for directly detecting preliminary tremors, wherein these units can be selectively switched.

The invention claimed is:

1. An earthquake damage spread reducing method for use in a semiconductor manufacturing apparatus including a boat for loading objects to be processed therein, in a multistage fashion, the method comprising:
   a step of receiving, via a communication circuit of a receiving unit, urgent earthquake information, based on preliminary tremors detected earlier than a principal shock of an earthquake, wherein said urgent earthquake information is received from a meteorological related agency and/or a third-presenter earlier than the principal shock,
   wherein, when the urgent earthquake information is received by the receiving unit, performing:
      a first step of stopping operation of the semiconductor manufacturing apparatus, earlier than the principal shock, based on the urgent earthquake information received by the receiving unit; and
      a second step of holding the boat, earlier than the principal shock, in order to prevent fall down of the boat, in which the objects to be processed are loaded in a multistage fashion, in parallel to the first step.

2. The earthquake damage spread reducing method for use in a semiconductor manufacturing apparatus according to claim 1, wherein in the second step performed in parallel to the first step, the boat is grasped and held, from above and below in order to prevent the fall down of the boat, in which the objects to be processed are loaded in a multistage fashion.

3. The earthquake damage spread reducing method for use in a semiconductor manufacturing apparatus according to claim 1, further comprising, after the second step, a third step of returning the boat to a home position in which the boat is carried out of a heating furnace, due to a lifting mechanism.

4. The earthquake damage spread reducing method for use in a semiconductor manufacturing apparatus according to claim 3, wherein the third step is performed after the second step as well as after the end of the principal shock.

5. An earthquake damage spread reducing system for use in a semiconductor manufacturing apparatus including a heating furnace having a furnace port, a cover for opening and closing the furnace port, and a boat placed on the cover and adapted to load objects to be processed therein in a multistage fashion, the system comprising:
   a receiving unit for receiving urgent earthquake information, based on preliminary tremors which are detected earlier than a principal shock, via a communication circuit, wherein said urgent earthquake information is received from a meteorological related agency and/or a third-presenter; and
   a control unit for performing, when the urgent earthquake information is received, a first step of stopping the operation of the semiconductor manufacturing apparatus earlier than the principal shock, and a second step of holding the boat earlier than the principal shock, in order to prevent fall down of the boat, in which the objects to be processed are loaded in a multistage fashion.

6. The earthquake damage spread reducing system for use in a semiconductor manufacturing apparatus according to claim 5, wherein the control unit performs the second step, such that the boat is grasped and held, from above and below.

7. The earthquake damage spread reducing system for use in a semiconductor manufacturing apparatus according to claim 6,
   wherein the semiconductor manufacturing apparatus further includes a lifting mechanism for carrying in or carrying out the boat relative to the heating furnace, with the boat placed on the cover, and a shutter adapted to cover the furnace port when the cover is opened; and
   wherein the control unit performs the second step, such that the boat is raised from a carrying out position due to the lifting mechanism, so as to bring a top end portion of the boat closer to or into contact with a bottom face of the shutter, whereby the boat can be grasped and held between the shutter and the cover, from above and below.

8. The earthquake damage spread reducing system for use in a semiconductor manufacturing apparatus according to claim 6,
   wherein the earthquake damage spread reducing system further comprises a boat fall down preventing mechanism for performing the second step, the boat fall down preventing mechanism comprising:
   an arm supported by a bearing portion, such that the arm can be pivoted by a biasing means from an evacuating position located aside an actuating position immediately above the boat to be placed in the carrying out position in which it is carried out of the furnace port;
   a locking mechanism for locking the arm in the evacuating position, the locking being optionally released by the control unit; and
   a guide groove provided in the bearing portion, such that the arm can be lowered to grasp and hold the boat, between the arm and the cover, from above and below, when the arm is pivoted from the evacuating position to the actuating position.

9. The earthquake damage spread reducing system for use in a semiconductor manufacturing apparatus according to claim 6,
wherein the semiconductor manufacturing apparatus includes:
a boat table provided in a loading area for carrying in or carrying out boats relative to the heating furnace, the boat table being adapted for placement of a boat thereon, wherein a boat placed on the boat table is capable of being interchangeably used with a boat placed on the cover; and
a boat carrier mechanism for carrying boats between the boat table and the cover,
wherein the control unit is configured to control the boat carrier mechanism, such that a boat placed on the boat table is raised, so as to bring a top end portion of the boat closer to or into contact with a ceiling portion in the loading area, whereby fall down of the boat can be prevented, by grasping and holding the boat, from above and below.

10. The earthquake damage spread reducing system for use in a semiconductor manufacturing apparatus according to claim 6,
wherein the semiconductor manufacturing apparatus includes:
a boat table provided in a loading area for carrying in or carrying out boats relative to the heating furnace, the boat table being adapted for placement of a boat thereon, wherein a boat placed on the boat table is capable of being interchangeably used with a boat placed on the cover; and
a loading mechanism for transferring the objects to be processed between a boat placed on the boat table and a container containing the plurality of objects to be processed therein,
wherein the control unit is configured to control the loading mechanism so as to bring it closer to or into contact with a top end portion of a boat placed on the boat table, whereby fall down of the boat can be prevented, by grasping and holding the boat, from above and below.

11. The earthquake damage spread reducing system for use in a semiconductor manufacturing apparatus according to claim 5,
wherein the semiconductor manufacturing apparatus includes:
a rotary mechanism for rotating the boat placed on the cover; and
a boat shower mechanism including a shower head, the shower head being longitudinally elongated and able to be advanced and retracted relative to the boat, in order to cool the boat to be carried out from the heating furnace, by blowing an inert gas against the boat, in the loading area for performing a carrying in or carrying out work for the boat relative to the heating furnace, and
wherein the control unit controls the rotary mechanism so as to rotate the boat placed on the cover and make it face the shower head as well as move the shower head closer to the boat, thereby to control leaping of the objects to be processed from the boat.

12. The earthquake damage spread reducing system for use in a semiconductor manufacturing apparatus according to claim 5,
wherein the semiconductor manufacturing apparatus includes:
a boat table for carrying in or carrying out boats relative to a heating furnace in a loading area, wherein the boat table includes a mounting portion for placement of a boat thereon, and a boat placed on the boat table is capable of being interchangeably used with a boat placed on the cover;
a fan filter unit for laterally injecting clean air toward a boat placed on the boat table;
a locking mechanism for locking the mounting portion such that a boat placed on the boat table will face a space opposite to the fan filter unit; and
a biasing means adapted to apply biasing force to the mounting portion to rotate it, such that a boat placed on the boat table will face the fan filter unit when the locking due to the locking mechanism is released,
wherein the control unit is configured to release the locking mechanism, and cause the biasing means to apply a biasing force to the mounting portion so as to make a boat placed on the boat table face the fan filter unit due to rotation of the mounting portion, thereby controlling leaping of the objects to be processed from the boat.

13. The earthquake damage spread reducing system for use in a semiconductor manufacturing apparatus according to claim 5, wherein the control unit performs a third step of returning the boat to a home position in which the boat is carried out of the heating furnace, due to a lifting mechanism, after the second step.

14. The earthquake damage spread reducing system for use in a semiconductor manufacturing apparatus according to claim 13, wherein the third step is performed after the second step as well as after the end of the principal shock.

* * * * *